CONNECTIONS IN SEMICONDUCTOR DEVICES

Filed March 10, 1961

INVENTOR.
Donald C. Dickson, Jr.
BY Mueller & Aichele
ATT'YS.

United States Patent Office 3,199,004

Patented Aug. 3, 1965

3,199,004

CONNECTIONS IN SEMICONDUCTOR DEVICES

Donald C. Dickson, Jr., Phoenix, Ariz., assignor to Motorola, Inc., Chicago, Ill., a corporation of Illinois Filed Mar. 10, 1961, Ser. No. 94,800

2 Claims. (Cl. 317—240)

This invention relates to semiconductor devices, and more particularly to the connection of a silicon die to a copper mounting and connector system in such devices.

In a typical silicon diode device, a silicon crystal element, which is sometimes called a die, is soldered on one side to a metal mounting base and on the other side to a metal connector. The silicon die contains a PN junction and the mounting base and connector together with the solder provide electrically and thermally conductive connections to the die on opposite sides of the junction. The mounting base and the connector are often made of copper material because it is comparatively inexpensive and is an effective conductor of both heat and electricity. Typically, the copper has had a plating of gold or nickel on it in commercially available silicon diodes. The solder connections have usually been made with lead-tin solder having a high lead content (about 90% lead or higher). Such connections have a melting point safely above the maximum junction temperature specified for the devices, and this temperature is usually 175° C. or higher.

However, it has been found that such solder does not wet a copper surface as well as might be desired to permit soldering the silicon die to bare copper surfaces on a production line for silicon diodes. The main problem is that after the copper surfaces are cleaned, preparatory to soldering, they can easily become oxidized before the soldering is actually done. If lead-tin solder with a high lead content is used, even slight oxidation of the copper will make the solder wet poorly, or at least the wetting is not entirely satisfactory for mass production soldering operations. In the soldering of connection for semiconductor devices, it is not usually practical to use flux, and all description of soldering in the present specification and claims refers to fluxless soldering.

It has been necessary as a practical matter to apply a coating or plating of oxidation-resistant material such as gold over the copper in order to provide surfaces which lead-tin solder of high lead content will wet reliably. If the entire mounting and connector system is plated in this manner, the cost of the completed device is increased substantially.

In addition to the considerations discussed above, the soldered connections must be able to withstand repeated heating and cooling over long periods of time, because the connections are heated every time the diode is energized and are cooled when it is de-energized. The ability of the solder connections to withstand repeated heating and cooling cycles over a long period of time is known as its resistance to thermal fatigue. The melting temperature of the solder must be above the specified maximum operating temperature of the device, but not so high as to require excessive heating of the die and other parts when the solder is melted during assembly of the device. Also, the thermal expansion and contraction characteristics of the solder connections must be compatible with those of the silicon die and the copper mounting and connector system.

Accordingly, it is an object of the present invention to provide a semiconductor device having a silicon die soldered to a mounting and connector system of bare copper material with the solder connections having satisfactory thermal fatigue resistance.

Another object of the invention is to provide such a device with connections between copper and silicon elements which connections are made with solder whose wetting and melting properties are such as to provide reliable connections when the soldering is accomplished without flux on a mass production assembly line.

A feature of the invention is the provision of indium-bearing solder connections between a silicon die and bare copper surfaces of a mounting and connector system in a semiconductor device, which connections have an unusually high degree of thermal fatigue resistance.

Referring now to the drawings.

Figure 1:
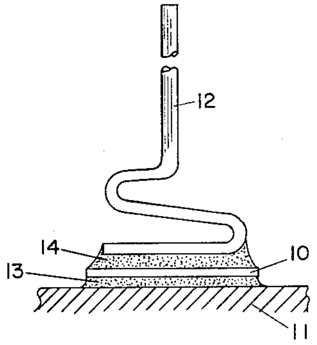
FIG. 1 is a fragmentary view of a portion of a semiconductor device in which a silicon die is connected to bare copper surfaces of a mounting base and a connector with indium-bearing solder.

Referring first to FIG. 1, there is shown a silicon die 10 which is connected mechanically, electrically and thermally to a mounting base 11 and to a connector 12 by masses of solder 13 and 14. The silicon die 10 has a diffused PN junction in it, and it is this junction which provides the fundamental rectifying characteristics of the die. Suitable methods for fabricating such a silicon die are well known in the art and will not be described herein. The die has metallic coatings on its two major sides, and these metallic coatings are more receptive to solder than the silicon material. Typically, there is an underlying coating of nickel and an overcoat of gold, and these materials may be applied to the die by plating techniques. The coatings are usually less than a thousandth of an inch thick, and the die may be from eight to twelve thousandths of an inch thick and from seventy to one hundred and twenty-five thousandths of an inch in diameter, for example.

The mounting base 11 and the lead 12 are of copper material. There is no exterior coating or plating over the copper. In other words, these parts have bare copper surfaces. The lower portion of the lead 12 is in the form of an S-shaped ribbon which provides an expansion joint to allow for dimensional changes of the parts due to temperature changes and to take up forces which may be applied to the lead 12. Leads or connectors of this type are well known in the art, and the configuration of the lead and other parts form no part of the present invention.

One significant thing about the assembly illustrated in FIG. 1 is that the silicon die 10 is soldered directly to bare copper material on both sides, and this provides a substantial cost saving because it is not necessary to coat either the connector or the mounting base with an oxidation resistant material such as gold or nickel. As has previously been mentioned, it has not been entirely satisfactory to solder a silicon die directly to bare copper parts in a mass production operation using ordinary lead-tin solder. The solder masses 13 and 14 are of an indium-silver-lead composition which has been found to be unusually effective for soldering a silicon die directly to copper in the manner illustrated in FIG. 1.

The solder masses 13 and 14 preferably contain from 1% to 10% indium and up to 5% silver, the balance being lead. The best results have been obtained using a solder which consists of 5% indium, 2.5% silver and 92.5% lead. The above proportions are percentages by weight of the individual elements based on the total composition.

Tests have been conducted on soldered assemblies of the type illustrated in FIG. 1, and these have established that the indium-bearing solder connections 13 and 14 have unusually good thermal fatigue resistance. In these tests, the soldered assemblies were subjected to repeated heating and cooling cycles for extended periods of time.

Specifically, the assemblies were suspended in an oven with the lead 12 downward and with a four ounce weight attached to the lead. The temperature in the oven was maintained at about 90° to 100° F. For the heating cycle, electrical power was applied to the assemblies for two minutes with about 15 amps. of current passing through the die 10, and this raised the case temperature of the assembly to about 250° F. In the cooling cycle, air was blown on the assemblies for two minutes with the electrical power off. The number of heating and cooling cycles occurring before one of the soldered connections separated was noted.

Some typical results from this testing are presented in Table I below. The results given here are numbers of heating and cooling cycles which occurred before failure of one of the solder connections. The first column is for samples in accordance with FIG. 1 in which the solder connections were of the preferred composition 5% indium, 2.5% silver and 92.5% lead. The other three columns are for samples which were of the same construction as those just referred to, except that the solder connections were of different compositions as identified at the head of each column. The average number of cycles occurring before failure is noted at the bottom of each column.

*Table I*

| Composition | 5% In, 2.5% Ag, 92.5% Pb | 5% Sn, 95% Pb | 10% Sn, 1.5% Ag, 88.5% Pb | 1% Sn, 1.5% Ag, 97.5% Pb |
|---|---|---|---|---|
| Cycles to Failure | 2,574 | 649 | 1,029 | 521 |
| | 2,518 | 732 | 1,034 | 501 |
| | 1,790 | 1,450 | 171 | 820 |
| | 2,884 | 1,445 | 588 | 1,051 |
| | 641 | 1,352 | 715 | 2,151 |
| | 600 | 1,068 | 219 | 769 |
| | 1,438 | 544 | 1,167 | 1,000 |
| | 1,026 | 1,922 | 1,171 | 1,442 |
| | 1,438 | 1,442 | 214 | 458 |
| | 1,434 | ----- | 925 | 1,448 |
| | 1,438 | ----- | 1,086 | 1,158 |
| | 1,438 | ----- | 1,174 | 1,442 |
| Average Cycles to Failure | 1,600 | 1,178 | 791 | 1,064 |

Figure 2:
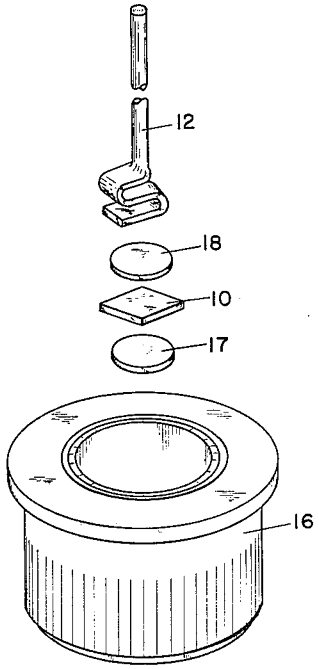
FIG. 2 is an exploded view illustrating how the parts of the assembly of FIG. 1 are put together and soldered.

From Table I it is apparent that the assemblies with the indium-bearing solder connections represent a substantial improvement in thermal fatigue resistance as compared to the samples. Furthermore, it has been found that the indium-bearing solder wets the bare copper surfaces of the mounting and connector system so well that it is practical to assemble the units in large quantities using this solder on a production line with high yields of commercially satisfactory units. FIG. 2 illustrates the manner in which this is done.

Figure 3:
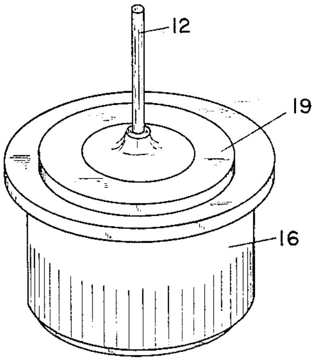
FIG. 3 is a perspective view of a completed silicon rectifier which merely illustrates one type of semiconductor device in which the invention is useful.

The mounting base 16 corresponds to the base 11 in FIG. 1, and its is of a cup-like construction in this particular example. However, the configuration of the base is not pertinent to the present invention. The copper surfaces on the mounting base and the connector are throughly cleaned before the parts are assembled. The mounting base is placed on an assembly line in an upright position with the opening at the top. A solder disc 17, a silicon die 10 and another solder disc 18 are stacked vertically in the order named on the bottom of the mounting base. The connector 12 is assembled with a cover 19 shown in FIG. 3 and this assembly is placed on top of the mounting base 16 such that the connector is aligned with and in contact with the solder disc 18. The resulting assembly is passed through a furnace and heated to a temperature of the order of 400° C. When the assembly cools, the die 10 has been soldered directly to the copper surfaces of the mounting base and lead. The cover 19 is then sealed to the top of the mounting base.

The specific melting point of the solder depends on the exact proportions of indium, silver and lead. For the preferred composition containing 5% indium, 2.5% silver and 92.5% lead the melting point is approximately 280° C. to 285° C. This is safely above the specified maximum operating temperature for most silicon diode devices. The particular device illustrated in FIG. 3 has a maximum specified junction temperature of 175° C. The thermal expansion characteristics of the indium-bearing solder connections have been found to be fully compatible with those of the copper and the silicon to which it is fused. These characteristics considered together with the improved thermal fatigue resistance and wetting properties discussed above make it possible to eliminate plating of the copper surfaces within the device enclosure and still produce a commercially acceptable device on a mass production basis. The exterior of the device may be plated with nickel, for example, after the assembly is completed to provide an attractive finish on the device.

I claim:

1. In a semiconductor device which has a semiconductor die of silicon material with a diffused PN junction therein and having parallel faces on opposite sides of said junction with thin films of metal plated on said faces, an improved system of connections providing mechanical, thermal and electrical connections to said die and including in combination, a mounting structure forming part of an enclosure for said die and having walls on the interior of said enclosure whose entire surface is of bare copper material, said mounting structure having a base portion on which said die is mounted with one side of said die facing said base portion, a lead structure of copper material having a portion on the interior of said enclosure whose entire surface is of bare copper material, and indium-bearing solder connections connecting said one side of said die directly to said bare copper surface of said mounting base and connecting the other side of said die to said bare copper surface of said lead structure, said solder connections consisting of about 5% by weight of indium, about 2.5% by weight of silver, and the balance of lead, and said solder connections forming bonds to said silicon die and to said mounting base and lead structure having comparatively great resistance to thermal fatigue as a result of the said composition of said solder connections.

2. In a semiconductor device, the combination of a semiconductor die of silicon material having a diffused PN junction therein and parallel faces on opposite sides of said junction, said die having thin films of metal plated on said faces for improving the solderability thereof, first and second solder connections respectively fused to said metal-plated faces of said silicon die and consisting of from 1% to 10% by weight of indium, up to 5% by weight of silver and the balance of lead, a mounting structure of copper material forming part of an enclosure for said die and having walls on the interior of said enclosure whose entire surface is of bare copper material, said mounting structure having a base portion on which said die is mounted through solder connections bonded to the copper of said base portion, and a lead structure of copper material having a portion on the interior of said enclosure whose entire surface is of bare copper material which is bonded to said die through solder connections, said solder connections and said bonds having comparatively great resistance to thermal fatigue as a result of the composition of said solder connections.

References Cited by the Examiner

UNITED STATES PATENTS 3,037,155 5/62 Zielasek ------------ 317—234

OTHER REFERENCES

Rose: "Versatile Indium," Scientific American, April 1944, page 155. (Available in Div. 14, 29/In Digest.)

JOHN W. HUCKERT, *Primary Examiner.*

SAMUEL BERNSTEIN, *Examiner.*